United States Patent
Smith et al.

(10) Patent No.: US 7,413,994 B2
(45) Date of Patent: Aug. 19, 2008

(54) HYDROGEN AND OXYGEN BASED PHOTORESIST REMOVAL PROCESS

(75) Inventors: Patricia Beauregard Smith, Colleyville, TX (US); Laura M. Matz, Murphy, TX (US); Vinay Shah, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 314 days.

(21) Appl. No.: 11/147,959

(22) Filed: Jun. 8, 2005

(65) Prior Publication Data

US 2006/0281312 A1     Dec. 14, 2006

(51) Int. Cl.
*H01L 21/461*  (2006.01)
*H01L 21/302*  (2006.01)

(52) U.S. Cl. .............................. 438/725; 257/E21.294; 438/329

(58) Field of Classification Search ................ 438/329, 438/725; 257/E21.294
See application file for complete search history.

(56) References Cited

U.S. PATENT DOCUMENTS

| | | | |
|---|---|---|---|
| 6,235,453 B1 * | 5/2001 | You et al. ................... | 430/329 |
| 6,251,771 B1 | 6/2001 | Smith et al. | |
| 6,693,043 B1 * | 2/2004 | Li et al. ...................... | 438/725 |
| 2003/0130147 A1 * | 7/2003 | Koito et al. ................. | 510/175 |

* cited by examiner

Primary Examiner—Asok K Sarkar
(74) Attorney, Agent, or Firm—W. James Brady, III; Frederick J. Telecky, Jr.

(57) ABSTRACT

The present invention provides a photoresist removal process and a method for manufacturing an interconnect using the same. One embodiment of the photoresist removal process includes, among other steps, providing a low dielectric constant (k) substrate having a photoresist layer located thereover, and removing the photoresist layer using a plasma which incorporates a gas which includes hydrogen or deuterium and a small amount of oxygen less than about 20 volume percent of the gas. Another embodiment of the photoresist removal process includes, among other steps, providing a low dielectric constant (k) substrate having a photoresist layer located thereover, removing a bulk portion of the photoresist layer using a plasma which incorporates a gas which includes hydrogen or deuterium, and removing a small portion of the photoresist layer using a plasma which incorporates a gas which includes oxygen, wherein the order of the two removing steps is interchangeable.

40 Claims, 5 Drawing Sheets

HYDROGEN AND OXYGEN BASED
PHOTORESIST REMOVAL PROCESS

TECHNICAL FIELD OF THE INVENTION

The present invention is directed, in general, to a photoresist removal process and, more specifically, to a hydrogen and oxygen based photoresist removal process and a method for manufacturing an interconnect using the same.

BACKGROUND OF THE INVENTION

Most semiconductor devices make use of several different levels of metallization. With the increasing complexity of devices and the need to reduce the physical size of devices, the number of metal interconnect levels is increasing. In addition, with the desire to increase the speed of the devices while reducing the power consumed by the devices, advanced metallization schemes are being developed. One such scheme involves the use of copper for the bus lines and interconnects. To improve the speed performance of the interconnect lines, interlevel dielectrics with lower dielectric constants than standard silicon dioxide films may be used as the insulating material situated between metallic structures. One such low dielectric constant interlevel dielectric material is OSG (organo-silicate glass).

Prior to the use of Cu for interconnection metal, aluminum metallization schemes used a standard, isotropic oxygen plasma etch to remove photoresist after a via or trench dielectric etch process. Unfortunately, it was observed that when Cu was used for the metallization, the etch removal of the photoresist with oxygen plasma at the 250° C. to 300° C. substrate temperatures typically used for Al metallization undesirably caused a substantial amount of oxidation to any exposed copper at the bottom of the via structures. It was also observed that etching the photoresist with substantial amounts of oxygen caused an undesirable reaction of oxygen with the Si-C bonding in the dielectric layer. When the dielectric layer is OSG, the material contains from 10-25% of C bound to Si. The removal of the Si-C bonding occurs when $O_2$ gas is used in plasmas exposed to OSG, and occurs for isotropic (250° C.-350° C.) or anisotropic (from room T to 300° C.) plasma processing. Removal of the Si-C bonding leads to an increase in the dielectric constant from approximately 2.9 for some forms of OSG, to close to 4.0, which is the dielectric constant of $SiO_2$. Accordingly, the use of oxygen to etch the photoresist dispenses with many of the benefits of using low dielectric constant interlevel dielectric materials.

In turn, the industry moved away from $O_2$ based photoresist etches to hydrogen-based photoresist etches, especially in those situations where copper metallization schemes and low dielectric constant interlevel dielectrics were being used. The original hydrogen based photoresist etches were conducted at relatively high temperatures (e.g., temperatures ranging from about 225° C. to about 350° C.). In certain situations, however, the relatively high temperatures caused an undesirable large amount of residue formation on the copper metallization structure.

Accordingly, it was discovered that lowering the temperature (e.g., to a substrate temperature of around 150° C.) of the hydrogen based photoresist etches would reduce the amount of residue formation on the copper metallization structure to an allowable amount that could be handled by various clean up steps. While the lower temperatures created less residue formation on the copper metallization structure, it also substantially reduced the etch rate of the hydrogen based photoresist etches. Unfortunately, in certain circumstances the lower temperature reduced the etch rate of the hydrogen based photoresist etches to a value too low to be useful in a practical manufacturing situation.

Accordingly, what is needed in the art is a hydrogen-based photoresist etch that accommodates the desires of the industry without experiencing the drawbacks of the prior art processes.

SUMMARY OF THE INVENTION

To address the above-discussed deficiencies of the prior art, the present invention provides a photoresist removal process and a method for manufacturing an interconnect using the same. One embodiment of the photoresist removal process includes, among other steps, providing a low dielectric constant (k) substrate having a photoresist layer located thereover, and removing the photoresist layer using a plasma that incorporates a gas which includes hydrogen or deuterium and a small amount of oxygen less than about 20 volume percent of the gas. Another embodiment of the photoresist removal process includes, among other steps, providing a low dielectric constant (k) substrate having a photoresist layer located thereover, removing a bulk portion of the photoresist layer using a plasma that incorporates a gas which includes hydrogen or deuterium, and removing a small portion of the photoresist layer using a plasma that incorporates oxygen gas, wherein the order of the two removing steps is interchangeable.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGS. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the unique recognition that oxygen gas may be introduced into hydrogen or deuterium based plasma etch processes to increase the etch rate of photoresist layers. For example, in one aspect the present invention acknowledged that small amounts of oxygen gas may be included with the hydrogen or deuterium to form a plasma that etches photoresist layers faster than the previous hydrogen or deuterium based plasmas that do not include oxygen gas. In another aspect, however, the present invention acknowledged that an oxygen gas based plasma could be conducted prior to or after the hydrogen or deuterium based plasma, to increase the overall etch rate of the photoresist layers. The aforementioned inclusion of oxygen gas, whether it be with the hydrogen or deuterium based plasma or in its own plasma, is particularly beneficial when used in conjunction with a low dielectric constant (k) substrate and/or a copper containing conductive feature, so long as the quantity or duration of the exposure of oxygen gas is low or short enough to not negatively interact with the low k material.

Figure 1:
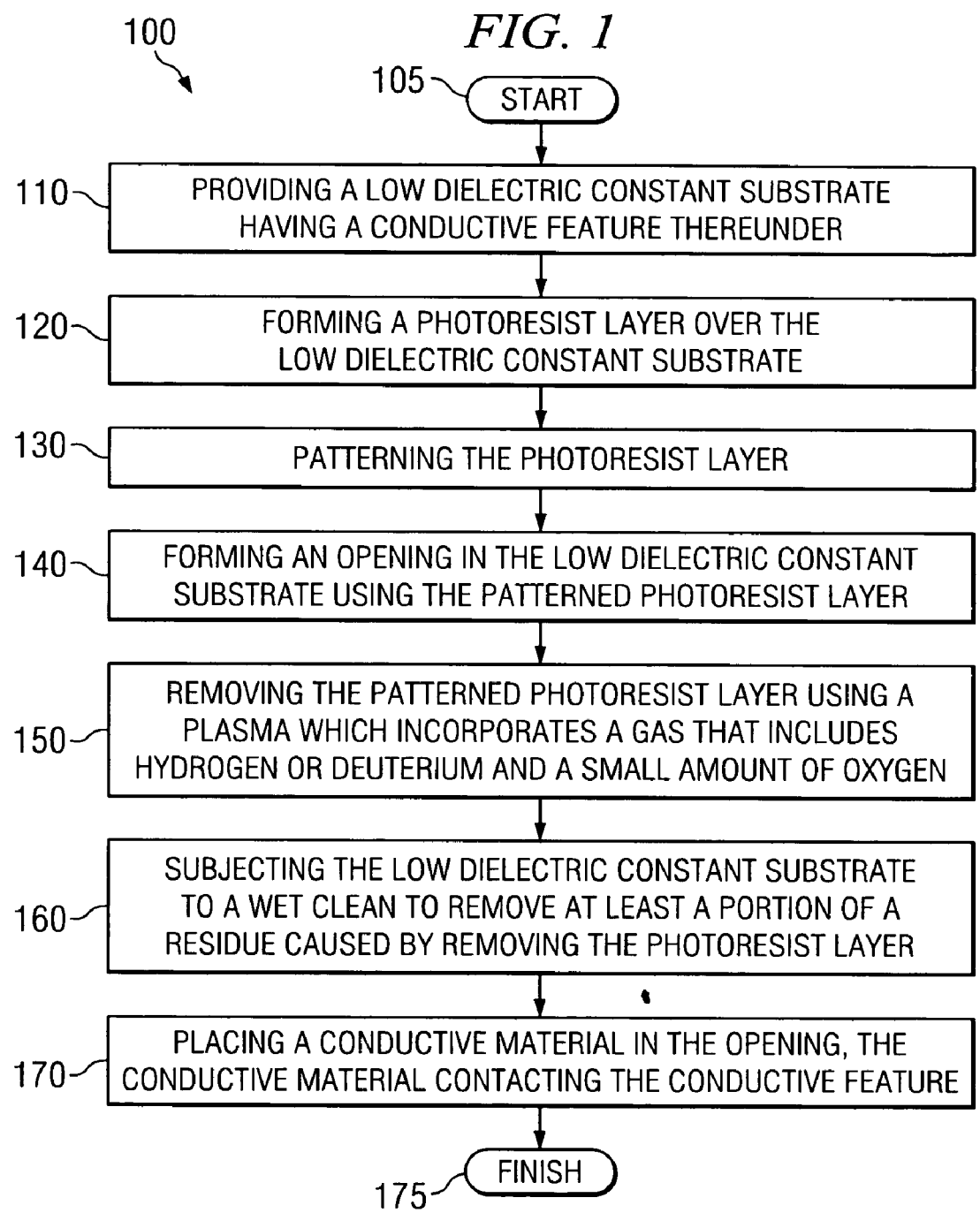
FIG. 1 illustrates a flow diagram of one embodiment of a method for manufacturing an interconnect structure in accordance with the principles of the present invention.

Turning now to FIG. 1, illustrated is a flow chart 100 setting out one embodiment for manufacturing an interconnect structure in accordance with the principles of the present invention. The method for manufacturing the interconnect structure described in the flow chart 100 of FIG. 1 also encompasses a unique photoresist removal process in accordance with the principles of the present invention. Accordingly, the two methods will be discussed together.

The method for manufacturing an interconnect structure in accordance with the principles of the present invention begins in a start step 105, shown in FIG. 1. Thereafter, in a step 110, a low dielectric constant (k) substrate having a conductive feature thereunder is provided. As used herein, a low dielectric constant (k) substrate is a substrate having a dielectric constant (k) less than that of silicon dioxide, and thus a dielectric constant (k) of less than about 3.9. As previously mentioned, positioned under the low dielectric constant (k) substrate is the conductive feature. While the conductive feature may comprise almost any conductive material, certain embodiments of the present invention benefit the most when the conductive feature is a copper containing conductive feature.

After step 110, a photoresist layer is formed over the low dielectric constant (k) substrate in a step 120. The photoresist layer may be any known or hereafter discovered photoresist layer that is in accordance with the principles of the present invention. After forming the photoresist layer in the step 120, the photoresist layer is conventionally patterned in a step 130. In an exemplary embodiment, the photoresist layer is conventionally patterned to have an opening therein, the opening being located over the conductive feature.

In a step 140, the patterned photoresist layer is conventionally used to form an opening in the low dielectric constant (k) substrate. In those embodiments wherein the opening in the patterned photoresist layer is located over the conductive feature, the opening in the low dielectric constant (k) material should also be located over the conductive feature.

Thereafter, in a unique step 150, the patterned photoresist layer is removed using a plasma which incorporates a gas that includes hydrogen or deuterium and a small amount of oxygen. The small amount of oxygen, as required in this embodiment, is a volume percent of oxygen that does not negatively affect the low dielectric constant (k) substrate, while increasing the etch rate for photoresist removal of the etch chemistry containing hydrogen or deuterium, such as less than about 20 volume percent of oxygen. In one particular advantageous embodiment, the small amount of oxygen is less than about 15 volume percent oxygen. In another exemplary embodiment, the small amount of oxygen ranges from about 7 volume percent oxygen to about 2 volume percent oxygen.

The patterned photoresist layer removal process of step 150 may further include an additional, non-reactive gas, used as a diluent gas in a mixture with the aforementioned hydrogen or deuterium and the small amount of oxygen gas. The diluent gas may comprise a number of different gases while staying within the scope of the present invention. In one particularly advantageous embodiment, however, the diluent gas is argon, helium, nitrogen, another inert gas, or a combination thereof.

The removing of the patterned photoresist layer in the step 150 often causes a residue to form on surfaces of the low dielectric constant (k) material and the conductive feature, thus in an optional step 160, the residue is removed using a wet clean process. The wet clean process ideally removes the entire residue from the surfaces. Thereafter, in a step 170, a conductive material is placed in the opening in the low dielectric constant (k) substrate to contact the conductive feature and form a functional interconnect structure. The process would then terminate in a step 175, or repeat with a new interconnect layer until the desired number of metal levels is produced, such as in a typical multiple-level interconnect structure.

Figure 2:
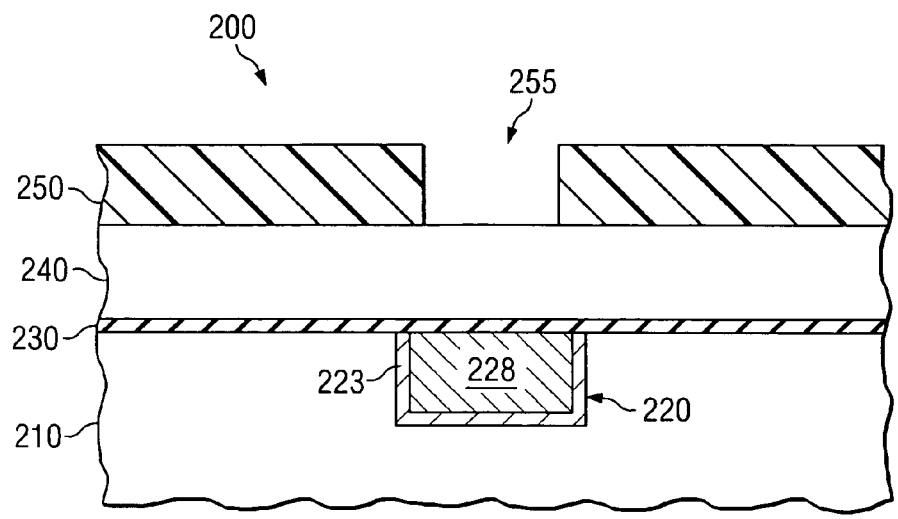
FIG. 2 illustrates a cross-sectional view of an interconnect structure at an initial stage of manufacture.

Turning now to FIGS. 2-6, with continued reference to FIG. 1, illustrated are cross-sectional views of detailed manufacturing steps illustrating how one might manufacture an interconnect structure in accordance with the principles of the present invention. While the embodiments illustrated in FIGS. 2-6 are directed to a single damascene interconnect structure, the unique aspects of the present invention are also applicable to dual damascene interconnect structures. FIG. 2 includes a partially completed interconnect structure 200, which initially includes a substrate 210 having a conductive feature 220 located therein or thereunder. The substrate 210 may comprise a variety of different configurations and materials without departing from the inventive aspects of the present invention. For instance, in the embodiment of FIG. 2 the substrate 210 is a low dielectric constant (k) substrate. Suitable low dielectric constant (k) substrates include, among others, OSG, BPSG, PSG, TEOS, aerogel, xerogel, HSQ, MSQ or any other low dielectric constant materials. Nevertheless, the substrate 210 may comprise other non low dielectric constant (k) substrates and remain within the scope of the present invention.

As previously mentioned, located in or under the substrate is a conductive feature 220. The conductive feature 220 may also comprise a number of different features while remaining within the scope of the present invention. In one aspect of the invention, the conductive feature 220 is a conductive trace, runner or trench traversing along at least a portion of an interlevel dielectric layer. In another aspect, however, the conductive feature 220 is a transistor device level feature, such as a gate electrode or source/drain contact region. Other conductive features 220 may also exist.

The conductive feature 220 illustrated in FIG. 2, however, happens to be a conductive trace, runner or trench. As illustrated, the conductive feature 220 includes a barrier/adhesion layer 223 and a conductive plug 228. The conductive plug 228 is preferably comprised of copper or copper-doped aluminum (preferably on the order of 0.5 to 2.5 wt % of copper in aluminum). Other copper containing conductive plugs 228, or for that matter other general conductive plugs, are within the scope of the present invention. The barrier/adhesion layer 223, among others, may be comprised of titanium, titanium nitride, a Ti/TiN stack, tantalum, tantalum nitride, or other barrier-like materials or mixtures of these materials that adhere well to copper, aluminum and/or the substrate 210

Optionally located over the substrate 210 and the conductive feature 220 may be a dielectric barrier layer 230. The dielectric barrier layer 230, in accordance with the principles of the present invention, may comprise silicon nitride, silicon carbide, SiCN or other similar materials, for example.

Positioned over the substrate 210 and the conductive feature 220 in the embodiment of FIG. 2 is a substrate 240. In the embodiment of FIG. 2 the substrate 240 is a low dielectric constant (k) substrate 240. The low dielectric constant (k) substrate 240, similar to the embodiment wherein the substrate 210 comprises a low dielectric constant (k) material, may comprise, among others, OSG, BPSG, PSG, aerogel, xerogel, HSQ, MSQ or any other low dielectric constant materials. Other embodiments exist wherein the substrate 240 does not comprise a low dielectric constant (k) material, such as TEOS.

Positioned over the low dielectric constant (k) substrate 240 is a photoresist layer 250. The photoresist layer 250 illustrated in FIG. 2 comprises only a single layer; however, those skilled in the art understand that the photoresist layer 250 could comprise any number of layers while staying within the scope of the present invention. For example, the photoresist layer may consist of multiple layers of different materials which when used together, enable the patterning of the features of interest. One such embodiment might be where the photoresist layer 250 comprises both a BARC portion and a photoresist portion. As illustrated in FIG. 2, the photoresist layer 250 has an opening 255 conventionally patterned therein. Those skilled in the art understand the process for forming and patterning the photoresist layer 250, thus no further detail is warranted.

Figure 3:
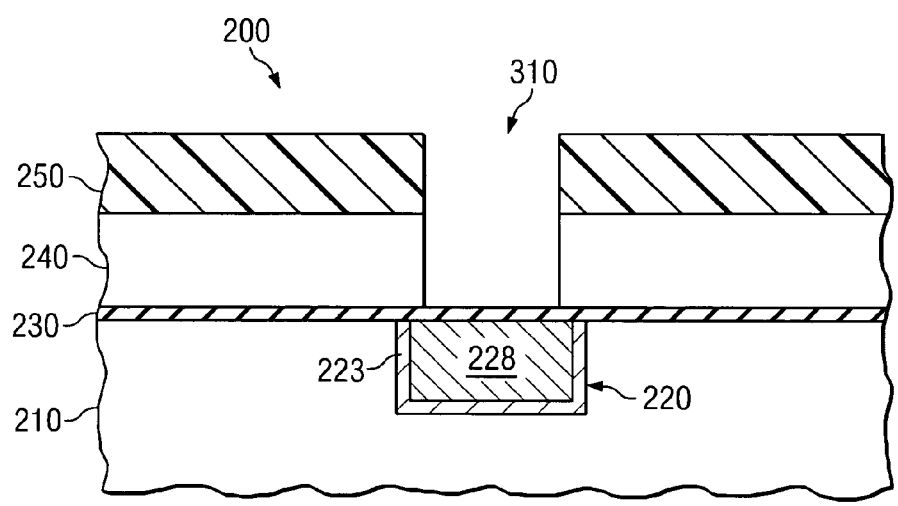
FIG. 3 illustrates a cross-sectional view of the partially completed interconnect structure illustrated in FIG. 2 after forming an opening in the low dielectric constant (k) substrate.

Turning now to FIG. 3, with continued reference to FIG. 1, illustrated is a cross-sectional view of the partially completed interconnect structure 200 illustrated in FIG. 2 after forming an opening 310 in the low dielectric constant (k) substrate 240 using the opening 255 (FIG. 2) in the photoresist layer 250. Preferably, this is accomplished by subjecting the low dielectric constant (k) substrate 240 to $CF_4$, $CHF_3$, or other fluorinated compound plasma environment, as well as other plasma environments known in the art to etch or remove dielectric materials. Nevertheless, any other known or hereafter discovered process could be used to form the opening 310. It should also be noted that certain embodiments may exist wherein a second process is used to remove the portion of the dielectric barrier layer 230 exposed by the low dielectric constant (k) substrate 240 etch. In this embodiment, a conventional fluorine containing plasma etch could be used to remove the exposed portion of the dielectric barrier layer 230.

Figure 4:
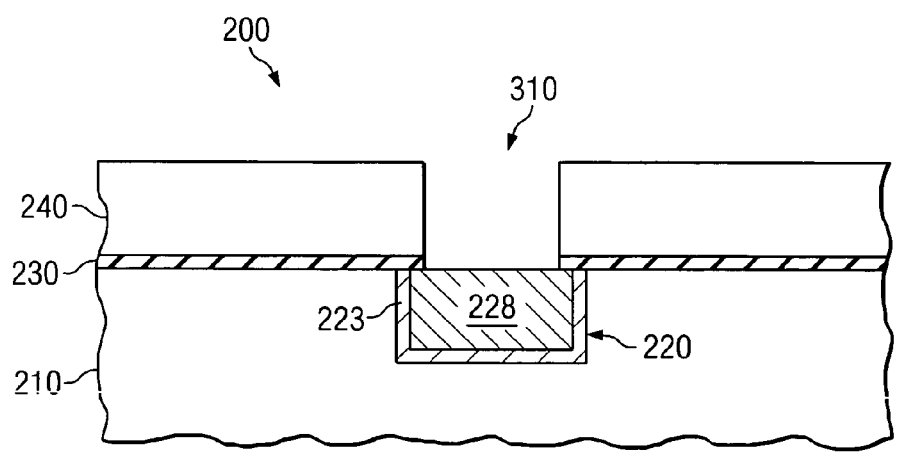
FIG. 4 illustrates a cross-sectional view of the partially completed interconnect structure illustrated in FIG. 3 after using the inventive aspects of the present invention to remove the photoresist layer.

Turning now to FIG. 4, with continued reference to FIG. 1, illustrated is a cross-sectional view of the partially completed interconnect structure 200 illustrated in FIG. 3 after using the inventive aspects of the present invention to remove the photoresist layer 250. In accordance with this embodiment of the present invention, the photoresist layer 250 is removed using a plasma that incorporates a gas that includes hydrogen or deuterium and a small amount of oxygen. The small amount of oxygen, as required in this embodiment, is a volume percent of oxygen that does not physically or chemically negatively affect the low dielectric constant (k) substrate 240, while increasing the etch rate of the hydrogen-based plasma on photoresist layers, such as less than about 20 volume percent of oxygen. In one particular advantageous embodiment, the small amount of oxygen is less than about 15 volume percent of oxygen. In another exemplary embodiment, the small amount of oxygen ranges from about 7 volume percent of oxygen to about 2 volume percent of oxygen.

Preferably, the photoresist layer 250 is removed by subjecting it to a photoresist removal step that uses a remote (or downstream) plasma. This process step can be accomplished in Mattson, Novellus, Axcelis or other similar commercially available processing tools. The hydrogen or deuterium may also be introduced with a nonreactive diluent gas such as argon, nitrogen, helium, neon or other inert gas (where the hydrogen or deuterium comprises from about 50 volume percent to about 100 volume percent of the gas mixture). In one particularly advantageous embodiment, hydrogen gas comprises from about 57 volume percent to about 59 volume percent, argon gas comprises from about 38 volume percent to about 39 volume percent, and oxygen gas comprises from about 5 volume percent to about 2 volume percent of the gases that form the plasma. Other combinations could, nonetheless, be used.

The processing conditions for the photoresist removal step are preferably around about: 0.1 to 3 Torr (preferably around 0.7 to 2 Torr) ambient pressure; flow rates of 2000-6000 $cm^3$/min; an operating temperature of less than about 350° C. (preferably ranging from about 100° C. to about 300° C., and more preferably from about 150° C. to about 250° C.), and an RF power ranging from about 500 Watts to about 2000 Watts. Those skilled in the art appreciate that other processing conditions could be used.

The removing of the patterned photoresist layer 250 often causes a residue to form on surfaces of the low dielectric constant (k) substrate 240, as in FIG. 4, and the dielectric barrier layer 230. Accordingly, in an optional step (e.g., such as step 160 of FIG. 1) the residue is removed using a wet clean process. The wet clean process ideally removes all of the residue from the surfaces. In an exemplary embodiment, the wet clean process includes a wet clean selected from the group consisting of commercially available fluoride-based cleaning solvents.

Figure 5:
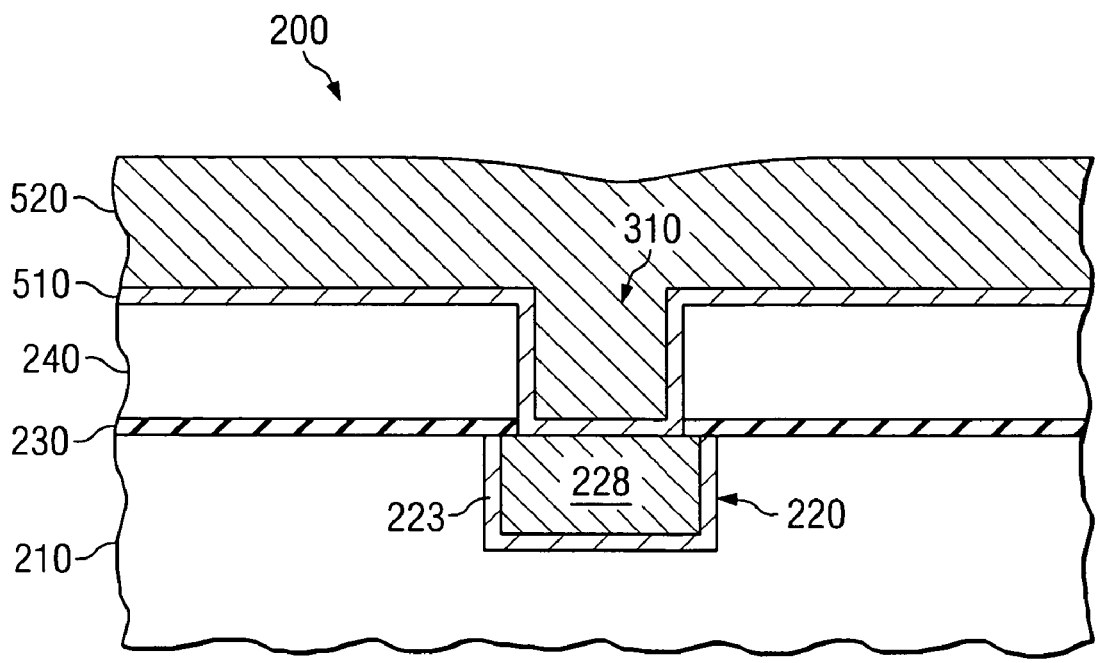
FIG. 5 illustrates a cross-sectional view of the partially completed interconnect structure illustrated in FIG. 4 after forming a conventional barrier/adhesion layer and conductive material within the opening in the low dielectric constant (k) substrate.

Turning now to FIG. 5, with continued reference to FIG. 1, illustrated is a cross-sectional view of the partially completed interconnect structure 200 illustrated in FIG. 4 after forming a conventional barrier/adhesion layer within the opening 310 in the low dielectric constant (k) substrate 240, such as the metal barrier/adhesion layer 510, and forming a blanket layer of conductive material 520 over the metal barrier/adhesion layer 510 and within the opening 310. The metal barrier/adhesion layer 510 may comprise similar types of materials as the barrier/adhesion layer 223, such as Ti, TiN, a Ti/TiN stack, Ta, TaN, a Ta/TaN stack or combinations of these or other useful metal barrier materials. Similarly, the blanket layer of conductive material 520 may comprise similar types of materials as the conductive plug 228. Therefore, in the embodiment of FIG. 5, the metal barrier/adhesion layer 510 comprises a tantalum/tantalum nitride stack and the blanket layer of conductive material 520 comprises copper or copper doped aluminum.

Figure 6:
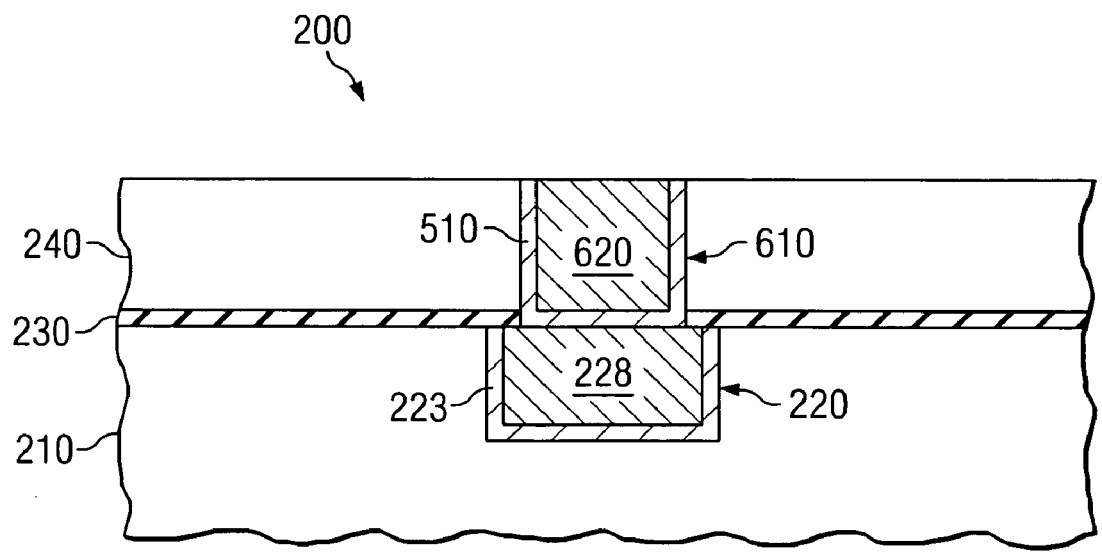
FIG. 6 illustrates a cross-sectional view of the partially completed interconnect structure illustrated in FIG. 5 after polishing the blanket layer of conductive material to form a second conductive feature.

Turning now to FIG. 6, with continued reference to FIG. 1, illustrated is a cross-sectional view of the partially completed interconnect structure 200 illustrated in FIG. 5 after conventionally polishing the blanket layer of conductive material 520 to form a second conductive feature 610. The second conductive feature 610, as those skilled in the art would expect, comprises the metal barrier/adhesion layer 510 and a conductive plug 620. The planarization is preferably accomplished by chemical-mechanical polishing (CMP) or a blanket etch-back process. The portions of the metal barrier/adhesion layer 510 located above the low dielectric constant (k) material are generally removed, as shown in FIG. 6. Further processing can be performed using standard device processing techniques, which would be obvious to one of ordinary skill in the art.

Figure 7:
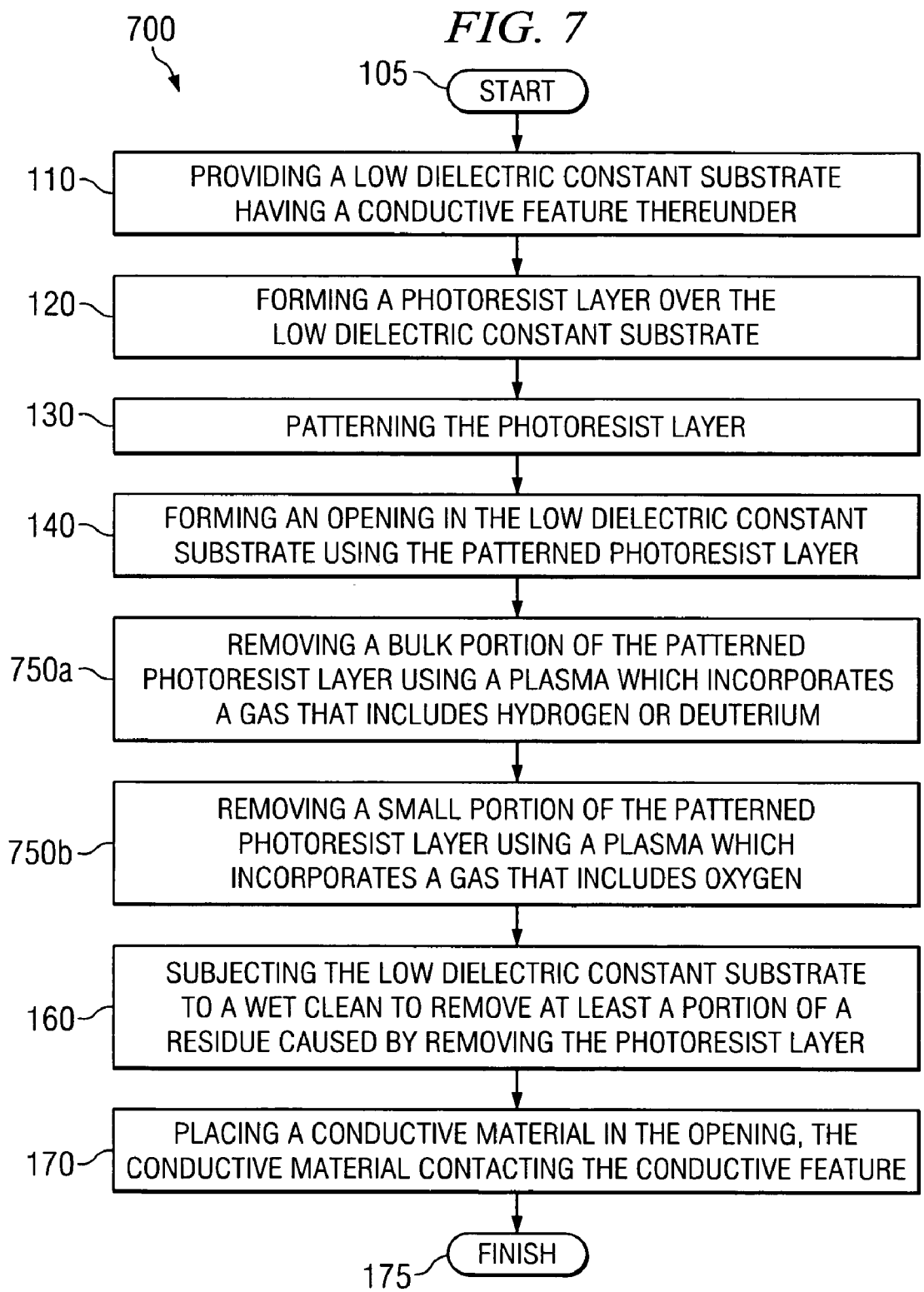
FIG. 7 illustrates a flow diagram of an alternative embodiment of a method for manufacturing an interconnect structure in accordance with the principles of the present invention.

Turning now to FIG. 7, with continued reference to FIG. 1, shown is a flow chart 700 illustrating an alternative embodiment for manufacturing an interconnect structure in accordance with the principles of the present invention. The method for manufacturing the interconnect structure described in the flow chart 700 of FIG. 7, similar to the flow chart 100 of FIG. 1, also encompasses a unique photoresist removal process in accordance with the principles of the present invention, and referred to as steps 750a and 750b in FIG. 7.

The method for manufacturing the interconnect structure described in flow chart 700 is substantially similar to the method for manufacturing the interconnect structure described in flow chart 100. Accordingly, many steps are the same. Thus, where like numbers are used for flow charts 700 and 100, the steps are substantially identical. The most distinct difference between the method of flow chart 700 and that of flow chart 100 resides in the removal process of the patterned photoresist layer.

After forming an opening in the low dielectric constant (k) substrate using the patterned photoresist layer in the step 140 of FIG. 7, a bulk portion of the photoresist layer may be removed using a plasma which incorporates a gas that includes hydrogen or deuterium, in a step 750a. In addition to the bulk portion of the patterned photoresist layer being removed, in the step 750a, a small portion of the photoresist layer may be removed using a plasma that incorporates a gas that includes oxygen, in a step 750b. An order has not been given for steps 750a and 750b because the order is interchangeable. For example, certain embodiments exist wherein the bulk portion of the photoresist layer is removed first in the step 750a, and then the small portion is removed second in the step 750b. However, in an alternative embodiment, the small portion of the photoresist layer is removed first in the step 750b, and then the bulk portion of the photoresist layer is removed second in the step 750a. The particular order will typically be based on the interconnect manufacturing process as a whole, and the desires of the manufacturer.

The process for removing the bulk portion of the photoresist layer, such as that of step 750a, should generally have similar processing conditions as those of step 150 of the flow diagram 100 of FIG. 1. For instance, the processing conditions of step 750a are preferably around about: 0.1 to 3 Torr (preferably around 0.7 to 2 Torr) ambient pressure; flow rates of 2000-6000 cm$^3$/min; an ambient temperature of less than about 350° C. (preferably ranging from about 100° C. to about 280° C., and more preferably from about 150° C. to about 250° C.), and an RF power ranging from about 500 Watts to about 2000 Watts. Those skilled in the art appreciate that other processing conditions could also be used for step 750a. Additionally, similar to step 150 of the flow diagram 100, a nonreactive diluent gas, such as argon, nitrogen, helium, neon or another inert gas, may be used in combination with the hydrogen or deuterium.

The process for removing the small portion of the photoresist layer, such as that of step 750b, may have different processing conditions. For instance, the processing conditions of step 750b are preferably around about: 0.1 Torr to 3 Torr ambient pressure, preferably around 0.7 to 2.0 Torr; flow rates of 2000 to 6000 cm$^3$/min (total flow rates); an operating temperature of less than about 350° C. (preferably ranging from 100° C. to about 280° C.), and an RF power ranging from 500 W to 2000 W. Similarly, the process of step 750b may be conducted as a flash etch for a time period of less than about 20 seconds while staying within the scope of the present invention. In one particularly advantageous embodiment, the process of step 750b is conducted for a time period ranging from about 5 seconds to about 15 seconds. Those skilled in the art appreciate that other processing conditions could also be used for step 750b. After completing steps 750a and 750b, the process would continue with step 160, which is substantially similar to the step 160 shown and discussed with respect to FIG. 1.

The advantages of using the photoresist removal method, and method for manufacturing an interconnect structure, in accordance with the principles of the present invention are abundant. First and foremost, the inclusion of the small amount of oxygen into the hydrogen or deuterium based plasma etch increases the photoresist removal rate by two-fold or more. Obviously, then, the throughput of the etch process substantially increases. Similarly, it is believed that the increased etch rate process has little or no impact on the low dielectric constant (k) substrates being used. Further, the process can be implemented with only minor adjustments to existing manufacturing processes.

Figure 8:
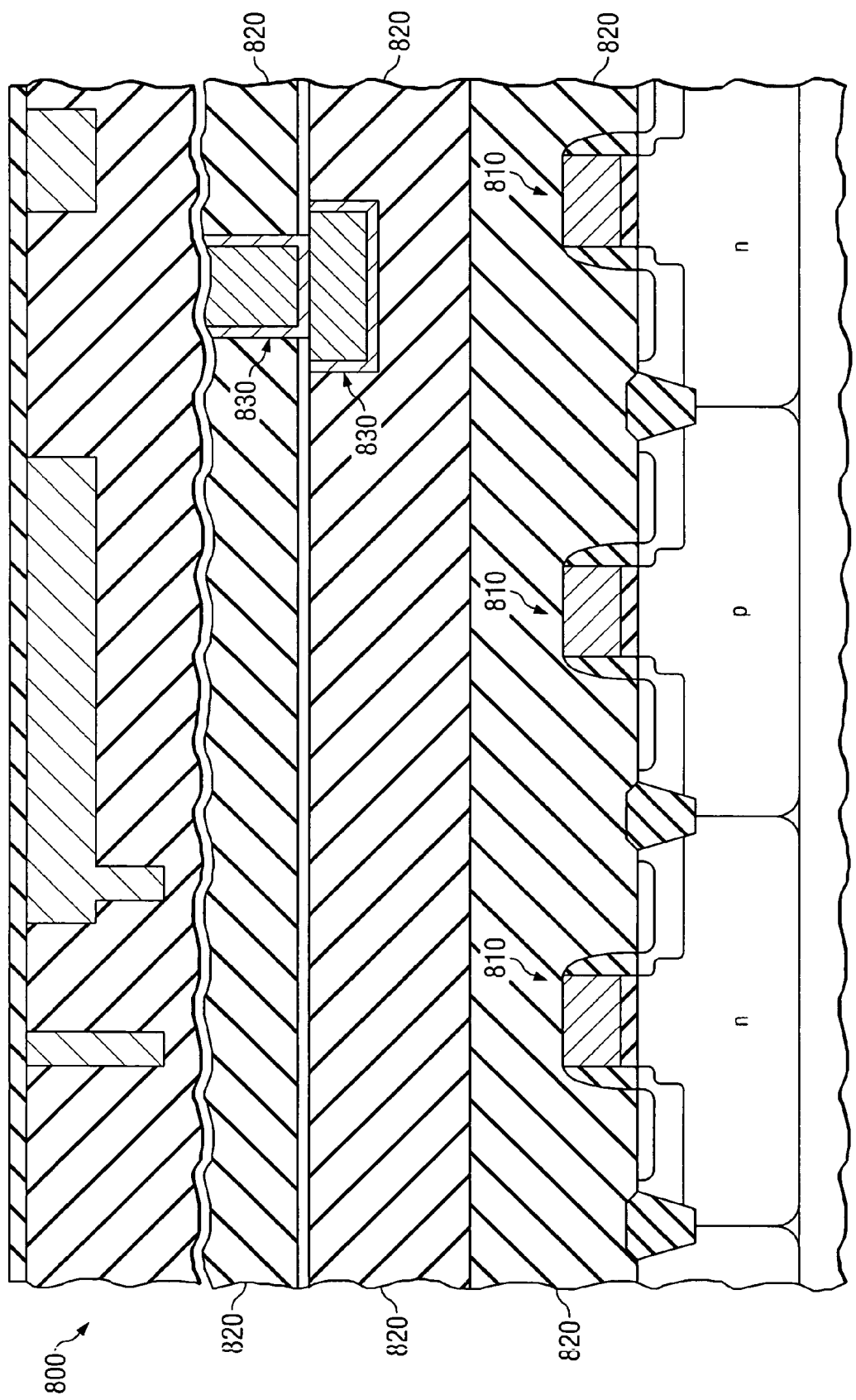
FIG. 8 illustrates a cross-sectional view of an integrated circuit manufactured in accordance with the principles of the present invention.

Referring now to FIG. 8, illustrated is an exemplary cross-sectional view of an integrated circuit (IC) 800 incorporating interconnect structures 830 constructed according to the principles of the present invention. The IC 800 may include devices, such as transistors used to form CMOS devices, BiCMOS devices, Bipolar devices, as well as capacitors or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes transistor devices 810 having dielectric layers 820 located thereover. Additionally, interconnect structures 830 are located within the dielectric layers 820 to interconnect various devices, thus, forming the operational integrated circuit 800.

Although the present invention has been described in detail, those skilled in the art should understand that they can make various changes, substitutions and alternations herein without departing from the spirit and scope of the invention in its broadest form.

What is claimed is:

1. A photoresist removal process, comprising:
    providing a low dielectric constant (k) substrate having a photoresist layer located thereover; and
    removing the photoresist layer using a plasma which incorporates a gas that includes hydrogen or deuterium and a small amount of oxygen less than about 20 volume percent of the gas, and further using a temperature ranging from about 100° C. to about 280° C.

2. The process as recited in claim 1 wherein the small amount of oxygen is less than about 15 volume percent of the gas.

3. The process as recited in claim 2 wherein the small amount of oxygen ranges from about 7 volume percent to about 2 volume percent of the gas.

4. The process as recited in claim 1 wherein the plasma further includes a nonreactive, diluent gas.

5. The process as recited in claim 4 wherein the nonreactive, diluent gas is argon, nitrogen, helium, neon or another inert gas.

6. The process as recited in claim 1 wherein removing the photoresist layer further includes subjecting the low dielectric constant (k) substrate to a wet clean to remove at least a portion of a residue caused by removing the photoresist layer using the plasma.

7. The process as recited in claim 6 wherein the wet clean includes a wet clean selected from the group consisting of fluoride-based cleaning solvents.

8. A method for manufacturing an interconnect structure, comprising:
providing a low dielectric constant (k) substrate having a patterned photoresist layer located thereover;
forming an opening in the low dielectric constant (k) substrate using the patterned photoresist layer;
removing the photoresist layer using a plasma which incorporates a gas that includes hydrogen or deuterium and a small amount of oxygen less than about 20 volume percent of the gas, and further using a temperature ranging from about 100° C. to about 280° C.; and
placing a conductive material within the opening.

9. The method as recited in claim 8 wherein the small amount of oxygen is less than about 15 volume percent of the gas.

10. The method as recited in claim 9 wherein the small amount of oxygen ranges from about 7 volume percent to about 2 volume percent of the gas.

11. The method as recited in claim 8 wherein the etch chemistry further includes a non-reactive, diluent gas.

12. The method as recited in claim 11 wherein the non-reactive, diluent gas is argon, nitrogen, helium, neon or another inert gas.

13. The method as recited in claim 8 wherein removing the photoresist layer further includes subjecting the low dielectric constant (k) substrate to a wet clean to remove at least a portion of a residue caused by removing the photoresist layer.

14. The method as recited in claim 13 wherein the wet clean includes a wet clean selected from the group consisting of fluoride-based cleaning solvents.

15. The method as recited in claim 8 wherein forming an opening in the low dielectric constant (k) substrate includes forming an opening in the low dielectric constant (k) substrate to a conductive feature.

16. The method as recited in claim 15 wherein the conductive feature and the conductive material include copper.

17. A photoresist removal process, comprising:
providing a low dielectric constant (k) substrate having a photoresist layer located thereover; and
removing a bulk portion of the photoresist layer using a plasma which incorporates a gas that includes hydrogen or deuterium, wherein a volume percent of the hydrogen or deuterium therein is greater than a volume percent of oxygen therein; and
removing a small portion of the photoresist layer using a plasma which incorporates a gas that includes oxygen gas.

18. The process as recited in claim 17 wherein the removing the bulk portion occurs prior to the removing the small portion.

19. The process as recited in claim 17 wherein the removing the small portion occurs prior to the removing the bulk portion.

20. The process as recited in claim 17 wherein the plasma which incorporates a gas that includes hydrogen or deuterium further includes a non-reactive diluent gas.

21. The process as recited in claim 20 wherein the non-reactive diluent gas is argon, nitrogen, helium, neon or another inert gas.

22. The process as recited in claim 17 wherein the removing the bulk portion and the removing the small portion includes removing using a temperature of less than about 350° C.

23. The process as recited in claim 22 wherein the removing the bulk portion and the removing the small portion includes removing using a temperature ranging from about 100° C. to about 280° C.

24. The process as recited in claim 17 further including subjecting the low dielectric constant (k) substrate to a wet clean to remove at least a portion of a residue caused by removing the photoresist layer.

25. The process as recited in claim 24 wherein the wet clean includes a wet clean selected from the group consisting of fluoride-based cleaning solvents.

26. The process as recited in claim 17 wherein the removing the small portion is a flash etch conducted for a time period less than about 20 seconds.

27. The process as recited in claim 26 wherein the time period ranges from about 5 seconds to about 15 seconds.

28. A method for manufacturing an interconnect structure, comprising:
providing a low dielectric constant (k) substrate having a patterned photoresist layer located thereover;
forming an opening in the low dielectric constant (k) substrate using the patterned photoresist layer;
removing a bulk portion of the photoresist layer using a plasma which incorporates a gas that includes hydrogen or deuterium, wherein a volume percent of the hydrogen or deuterium therein is greater than a volume percent of oxygen therein;
removing a small portion of the photoresist layer using a plasma which incorporates a gas that includes oxygen; and
placing a conductive material within the opening.

29. The method as recited in claim 28 wherein the removing the bulk portion occurs prior to the removing the small portion.

30. The method as recited in claim 28 wherein the removing the small portion occurs prior to the removing the bulk portion.

31. The method as recited in claim 28 wherein the plasma which incorporates a gas that includes hydrogen or deuterium further includes a non-reactive diluent gas.

32. The method as recited in claim 31 wherein the non-reactive diluent gas is argon, nitrogen, helium, neon or another inert gas.

33. The method as recited in claim 28 wherein the removing the bulk portion and the removing the small portion includes removing using a temperature of less than about 350° C.

34. The method as recited in claim 33 wherein the removing the bulk portion and the removing the small portion includes using a temperature ranging from about 100° C. to about 280° C.

35. The method as recited in claim 28 further including subjecting the low dielectric constant (k) substrate to a wet clean to remove at least a portion of a residue caused by removing the photoresist layer.

36. The method as recited in claim 35 wherein the wet clean includes a wet clean selected from the group consisting of fluoride-based cleaning solvents.

37. The method as recited in claim 28 wherein the removing the small portion is a flash etch conducted for a time period less than about 20 seconds.

38. The method as recited in claim 37 wherein the time period ranges from about 5 seconds to about 15 seconds.

39. The method as recited in claim 28 wherein forming an opening in the low dielectric constant (k) substrate includes forming an opening in the low dielectric constant (k) substrate to a conductive feature.

40. The method as recited in claim 39 wherein the conductive feature and the conductive material include copper.

* * * * *